(12) United States Patent
Yokoyama et al.

(10) Patent No.: US 7,107,555 B2
(45) Date of Patent: Sep. 12, 2006

(54) METHOD AND APPARATUS FOR DESIGNING HIGH-FREQUENCY CIRCUIT, AND DISPLAY METHOD FOR USE IN DESIGNING HIGH-FREQUENCY CIRCUIT

(75) Inventors: Naoto Yokoyama, Nakamuroda Haruna-Machi (JP); Masayuki Shimizu, Nakamuroda Haruna-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 230 days.

(21) Appl. No.: 10/903,163

(22) Filed: Jul. 30, 2004

(65) Prior Publication Data

US 2005/0028117 A1    Feb. 3, 2005

(30) Foreign Application Priority Data

Jul. 31, 2003    (JP) .............................. 2003-204835

(51) Int. Cl.
*G06F 17/50*    (2006.01)
*G06F 19/00*    (2006.01)

(52) U.S. Cl. .................................. 716/5; 716/2; 703/2

(58) Field of Classification Search .................... 716/5, 716/2; 703/2

See application file for complete search history.

(56) References Cited

U.S. PATENT DOCUMENTS

| | | | | |
|---|---|---|---|---|
| 5,617,326 | A * | 4/1997 | Yamamoto | 703/14 |
| 5,625,578 | A * | 4/1997 | Du Cloux et al. | 703/2 |
| 5,956,500 | A * | 9/1999 | Shimmell | 703/7 |
| 6,023,573 | A * | 2/2000 | Bai et al. | 703/2 |
| 6,041,170 | A * | 3/2000 | Feldmann et al. | 703/2 |
| 6,385,565 | B1 * | 5/2002 | Anderson et al. | 703/18 |
| 6,532,439 | B1 * | 3/2003 | Anderson et al. | 703/14 |
| 6,539,531 | B1 * | 3/2003 | Miller et al. | 716/15 |
| 6,546,528 | B1 * | 4/2003 | Sasaki et al. | 716/5 |
| 6,604,225 | B1 * | 8/2003 | Otsu et al. | 716/3 |
| 6,637,008 | B1 * | 10/2003 | Higuchi et al. | 716/2 |
| 6,654,711 | B1 * | 11/2003 | Wang et al. | 703/13 |
| 6,654,944 | B1 * | 11/2003 | Dike | 716/17 |

(Continued)

FOREIGN PATENT DOCUMENTS

JP    11312187 A  *  11/1999

OTHER PUBLICATIONS

Martin et al., "Some Results About the Behaviour of the Characteristic Frequencies in Electric Circuits", 1998 IEEE International Conference on Electronics, Circuits and Systems, vol. 2, pp. 509-512.*

(Continued)

*Primary Examiner*—Phallaka Kik
(74) *Attorney, Agent, or Firm*—Knobbe Martens Olson & Bear, LLP

(57) ABSTRACT

An method and apparatus for designing a high-frequency circuit perform replacing component items by component equivalent circuits in which corresponding component items have frequency characteristics, calculating evaluation data items for the replaced component equivalent circuits, while changing frequency, by a polynomial-frequency-function expression, obtaining the frequency characteristics of the component items, and evaluating circuit characteristics. When the result of evaluation indicates that the targeted circuit characteristics cannot be obtained, at least one of the component equivalent circuits in the circuit model is replaced by another component equivalent circuit corresponding to a component item having different electrical characteristics. The expression is used to calculate again evaluation data for evaluating the replaced component equivalent circuit, and circuit characteristics are evaluated again by using frequency characteristics based on the calculated evaluation data items.

10 Claims, 2 Drawing Sheets

U.S. PATENT DOCUMENTS

| | | | |
|---|---|---|---|
| 6,658,376 B1* | 12/2003 | Wang et al. | 703/13 |
| 6,711,723 B1* | 3/2004 | Tsai et al. | 716/4 |
| 6,725,430 B1* | 4/2004 | Draxler et al. | 716/1 |
| 6,772,400 B1* | 8/2004 | Tsai | 716/4 |
| 6,774,641 B1* | 8/2004 | Sasaki et al. | 324/627 |
| 6,778,025 B1* | 8/2004 | Leuthold | 331/16 |
| 6,845,491 B1* | 1/2005 | Miller et al. | 716/1 |
| 6,854,102 B1* | 2/2005 | Maheshwari | 716/6 |
| 6,950,785 B1* | 9/2005 | Billings et al. | 703/2 |
| 7,003,744 B1* | 2/2006 | Weller et al. | 716/4 |
| 7,013,257 B1* | 3/2006 | Nolan et al. | 703/28 |
| 7,039,572 B1* | 5/2006 | Narahara et al. | 703/14 |
| 7,039,885 B1* | 5/2006 | Mohan | 716/4 |
| 2001/0034587 A1* | 10/2001 | Anderson et al. | 703/2 |
| 2002/0083406 A1* | 6/2002 | Tsai et al. | 716/10 |
| 2003/0084415 A1* | 5/2003 | Sasaki et al. | 716/4 |
| 2003/0101418 A1* | 5/2003 | Draxler et al. | 716/1 |
| 2003/0115568 A1* | 6/2003 | Miller et al. | 716/15 |
| 2003/0200068 A1* | 10/2003 | Tanaka et al. | 703/2 |
| 2004/0128633 A1* | 7/2004 | Weller et al. | 716/4 |
| 2005/0125751 A1* | 6/2005 | Miller et al. | 716/4 |
| 2005/0273742 A1* | 12/2005 | Issa et al. | 716/6 |

OTHER PUBLICATIONS

Englebrecht et al., "A Wide-Band Low Noise L-band Balanced Transistor Amplifier", Proceedings of the IEEE, vol. 53, No. 3, Mar. 1965, pp. 237-247.*

* cited by examiner

METHOD AND APPARATUS FOR DESIGNING HIGH-FREQUENCY CIRCUIT, AND DISPLAY METHOD FOR USE IN DESIGNING HIGH-FREQUENCY CIRCUIT

This is a U.S. patent application claiming foreign priority under 35 U.S.C. § 119 to Japanese Patent Application No. 2003-204835, filed Jul. 31, 2003, the disclosure of which is herein incorporated by reference in their entirety.

BACKGROUND OF THE INVENTION

1. Field of the Invention

The present invention generally relates to a method and apparatus for designing a high-frequency circuit, and a display method for use in designing a high-frequency circuit.

2. Description of the Related Art

Recently, it is common to use computer simulations to design electronic circuits and to evaluate circuit characteristics. However, this has a problem in that, when common component characteristic data items for use in designing high-frequency circuits, such as an image parameter (F parameter), an impedance parameter (Z parameter), an admittance parameter (y parameter), and a hybrid parameter (h parameter), are used, a designed high-frequency circuit cannot have the targeted circuit characteristics. Accordingly, recently, in order to eliminate the above problem, scattering parameters (S parameters) that represent the elements of a scattering matrix (S matrix) representing relationships between incident waves and reflected waves are used as component characteristic data items to design a high-frequency circuit and to evaluate circuit characteristics.

The S parameters have an advantage in that the use of the S parameters enables highly accurate evaluation of circuit characteristics because the S parameters are obtained by using a network analyzer to actually measure the frequency characteristics of component items. For circuit design and evaluation of circuit characteristics, S-parameter data tables for component items, provided by component manufacturers, must be prepared.

Since the S-parameter data tables provided by the component manufacturers basically bear magnitude and angles (phase) for measured frequencies, accurate evaluation of circuit characteristics cannot be performed for frequencies which are not described in the tables. Specifically, by using an S-parameter data table having magnitude and angles in units of 0.5 GHz, such as 0.5 GHz, 1.0 GHz, 1.5 GHz, 2.0 GHz, and 2.5 GHz, accurate evaluation of circuit characteristics cannot be performed for a frequency between two measured frequencies, such as 0.9 GHz, 1.2 GHz, and 2.3 GHz.

SUMMARY OF THE INVENTION

The present invention has been made in view of the above circumstances. It is an object of the present invention to provide a high-frequency-circuit designing apparatus and method that easily and accurately perform circuit design and evaluation of circuit characteristics by using a frequency function to calculate evaluation data instead of S parameters without using S-parameter data tables for component items, and a display method for use in designing a high-frequency circuit.

According to an aspect of the present invention, a method of designing a high-frequency circuit. The method includes the steps of setting up a circuit model obtained in a way that component items constituting a basic circuit are respectively replaced by component equivalent circuits having corresponding component items having frequency characteristics, performing calculation of evaluation data items for evaluating the component equivalent circuits in the circuit model, while changing frequency, by using the polynomial frequency function:

$$Xsf=Xs(n) \times Freq^n + Xs(n-1) \times Freq^{(n-1)} + \ldots Xs(0)$$

where Xs represents the parameter of an electric component, Freq represents a frequency, and n represents an integer of 2 or greater, obtaining the frequency characteristics of the component items of the basic circuit based on the evaluation data items, and using the obtained frequency characteristics to evaluate circuit characteristics, and, when the result of evaluation indicates that the targeted circuit characteristics are not obtained, replacing at least one of the component equivalent circuits in the circuit model by another component equivalent circuit corresponding to a component item having a different electrical characteristic, using the expression to calculate again evaluation data for evaluating the replaced component equivalent circuit, and evaluating again circuit characteristics by using frequency characteristics based on the calculated evaluation data items.

According to another aspect of the present invention, an apparatus for designing a high-frequency circuit is provided. The apparatus includes a setup unit for setting up a circuit model obtained in a way that component items constituting a basic circuit are respectively replaced by component equivalent circuits having corresponding component items having frequency characteristics, an evaluating unit for performing calculation of evaluation data items for evaluating the component equivalent circuits in the circuit model, while changing frequency, by using the polynomial frequency function:

$$Xsf=Xs(n) \times Freq^n + Xs(n-1) \times Freq^{(n-1)} + \ldots Xs(0)$$

where Xs represents the parameter of an electric component, Freq represents a frequency, and n represents an integer of 2 or greater, obtaining the frequency characteristics of the component items of the basic circuit based on the evaluation data items, and using the obtained frequency characteristics to evaluate circuit characteristics, and replacing means which, when the result of evaluation indicates that the targeted circuit characteristics are not obtained, performs replacing at least one of the component equivalent circuits in the circuit model by another component equivalent circuit corresponding to a component item having a different electrical characteristic, using the expression to calculate again evaluation data for evaluating the replaced component equivalent circuit, and evaluating again circuit characteristics by using frequency characteristics based on the calculated evaluation data items.

According to still another aspect of the present invention, a display method for use in designing a high-frequency circuit is provided. The display method includes the steps of displaying a circuit model obtained in a way that component items constituting a basic circuit are respectively replaced by component equivalent circuits having corresponding component items have frequency characteristics, performing calculating evaluation data items for evaluating the component equivalent circuits in the circuit model, while changing frequency, by using the polynomial frequency function:

$$Xsf=Xs(n) \times Freq^n + Xs(n-1) \times Freq^{(n-1)} + \ldots Xs(0)$$

where Xs represents the parameter of an electric component, Freq represents a frequency, and n represents an integer of 2 or greater, obtaining the frequency characteristics of the component items of the basic circuit based on the evaluation data items, and using the obtained frequency characteristics to display evaluation of circuit characteristics, and, when the result of evaluation indicates that the targeted circuit characteristics are not obtained, replacing at least one of the component equivalent circuits in the circuit model by another component equivalent circuit corresponding to a component item having a different electrical characteristic, using the expression to calculate again evaluation data for evaluating the replaced component equivalent circuit, and displaying evaluation of circuit characteristics again by using frequency characteristics based on the calculated evaluation data items.

According to at least one embodiment of the present invention, it is not necessary to prepare S-parameter data tables for component items. In addition, by using frequency functions, evaluation data items instead of S parameters are calculated. This enables facilitated and accurate circuit design and evaluation of circuit characteristics.

In all of the foregoing embodiments, any element used in an embodiment can interchangeably be used in another embodiment, and any combination of elements can be applied in these embodiments, unless it is not feasible.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further objects, features and advantages of the present invention will become apparent from the following description of the preferred embodiments with reference to the attached drawings.

BRIEF DESCRIPTION OF THE DRAWINGS

These and other features of this invention will now be described with reference to the drawings of preferred embodiments which are intended to illustrate and not to limit the invention.

DESCRIPTION OF THE PREFERRED EMBODIMENTS

As explained above, the present invention can be accomplished in various ways including, but not limited to, the foregoing embodiments. The present invention will be explained in detail with reference to the drawings, but present invention should not be limited thereto.

A high-frequency-circuit designing method according to an embodiment of the present invention is described below with reference to the accompanying drawings.

By way of example, when designing a high-pass filter having a predetermined cutoff frequency, at first, based on technical knowledge and empirical rules of a designer, a basic circuit in which the targeted circuit characteristics can be obtained by combining necessary component items, as required, is envisaged. Specifically, the basic circuit shown in FIG. 2 (see the step S1 shown in FIG. 1), which is formed by connecting in series two low-capacitance capacitors C having predetermined capacitances and connecting in parallel thereto a high frequency inductor L having a predetermined inductance, is set up.

Figure 2:
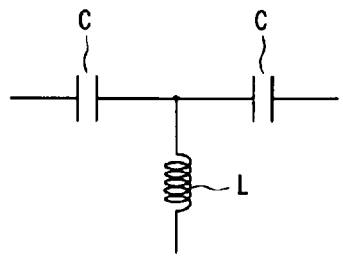
FIG. 2 is a circuit diagram illustrating the basic-circuit setup step shown in FIG. 1.
Figure 3:
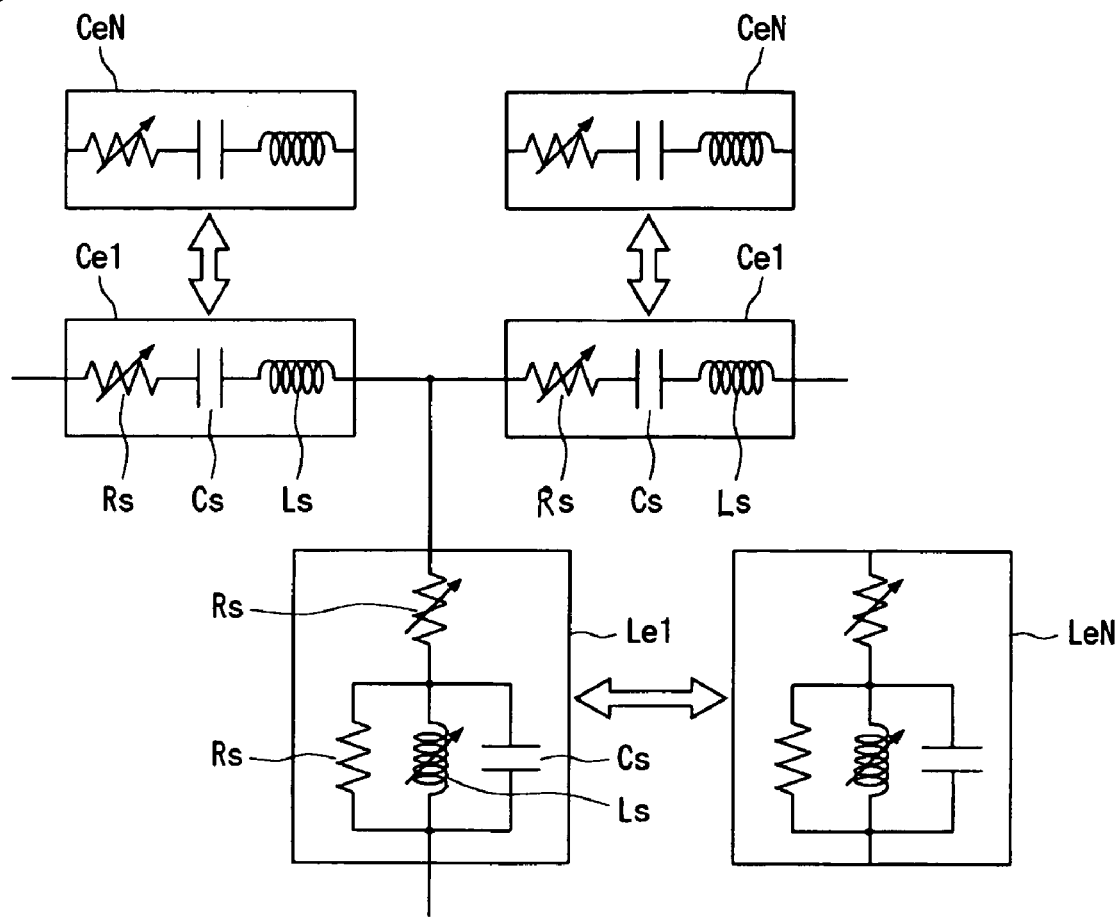
FIG. 3 is a circuit diagram illustrating the circuit-model setup step and frequency-characteristic-component-equivalent-circuit replacing step shown in FIG. 1.

Next, the circuit model shown in FIG. 3 (see the step S2 shown in FIG. 2) is set up. This circuit model is obtained in a way that the component items of the basic circuit shown in FIG. 2 are replaced by frequency-characteristic equivalent circuits (component equivalent circuits in which component items have frequency characteristics) corresponding to the prepared capacitors C and inductor L.

The frequency-characteristic equivalent circuits Ce1 shown in FIG. 3 correspond to the low-capacitance capacitors C. Here, when considering a phenomenon in which the value of a resistance component Rs decreases with frequency and increases after a resonance point, only the resistance component Rs is provided with a frequency characteristic, but a capacitance component Cs and an inductance component Ls are not provided with frequency characteristics. In addition, the frequency-characteristic equivalent circuit Le1 shown in FIG. 3 corresponds to the high frequency inductor L. Here, when considering a phenomena in which a resistance component Rs increases with frequency and in which an inductance component Ls decreases with the frequency, only one resistance component Rs and the inductance component Ls are provided with frequency characteristics, but the other resistance component Rs and the capacitance component Cs are not provided with frequency characteristics.

Next, the characteristics of the circuit model in FIG. 3 are evaluated (see the step S3 shown in FIG. 2). In evaluation of the characteristics, evaluation data for evaluating the frequency-characteristic equivalent circuits Ce1 and Le1 in the circuit model in FIG. 3 is calculated by using the following frequency function.

Specifically, evaluation data Rsf is calculated, while changing the frequency, by using the expression:

$$Rsf = Rs(n) \times Freq^n + Rs(n-1) \times Freq^{(n-1)} + \ldots Rs(0)$$

where Rs represents a resistance component, Freq represents a frequency, and n represents an integer of 2 or greater.

In addition, in the frequency-characteristic equivalent circuit Le1 in FIG. 3 which corresponds to the high frequency inductor L, the resistance component Rs and the inductance component Ls are provided with frequency characteristics. Thus, evaluation data Rsf is calculated by the above expression, and evaluation data Lsf is calculated, while changing the frequency, by the expression:

$$Lsf = Ls(n) \times Freq^n + Ls(n-1) \times Freq^{(n-1)} + \ldots Ls(0)$$

where Ls represents an inductance component, Freq represents a frequency, and n represents an integer of 2 or greater.

Figure 1:
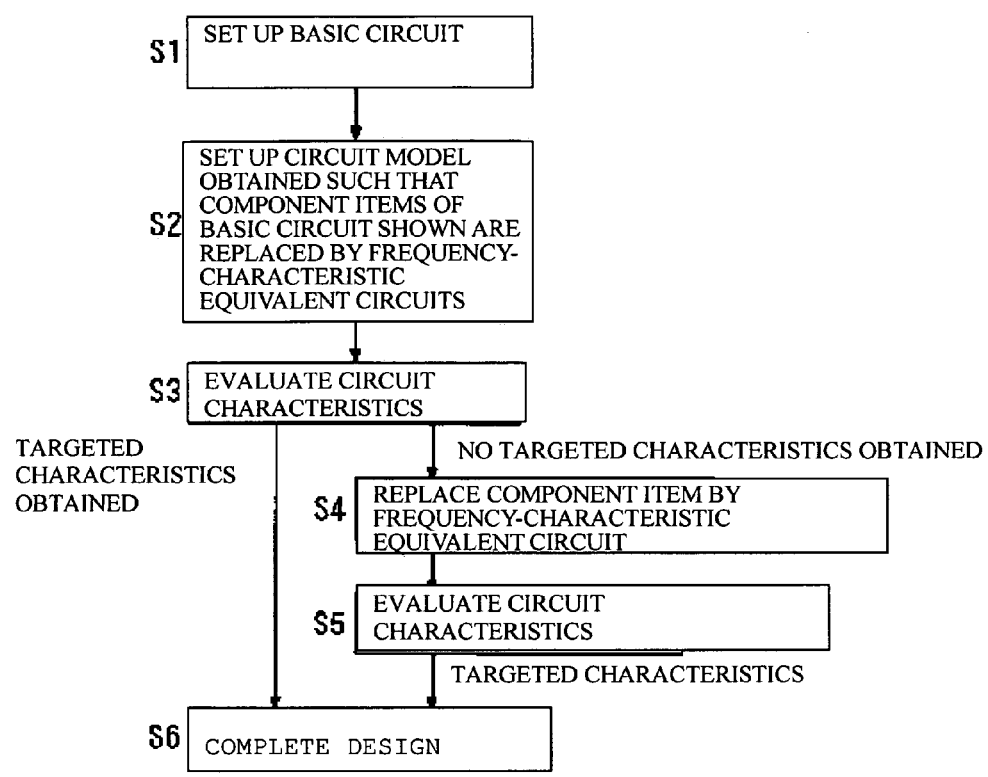
FIG. 1 is a flowchart showing a circuit design process of an embodiment of the present invention.

Based on the above evaluation data Rsf and Lsf, the frequency characteristics of initially selected capacitors C and inductor L are obtained, and the obtained frequency characteristics are used to evaluate circuit characteristics (see the step S3 shown in FIG. 1).

The above expressions are polynomial functions each having frequency as a variable. Thus, by setting the frequency and the value of n, evaluation data for the frequency can be easily calculated, and sequential evaluation data items in arbitrary frequency units and frequency range can be obtained as values approximately equal to those actually measured. Thus, based on the obtained evaluation data items, the frequency characteristics of the capacitor C and the inductor L can accurately be obtained.

When the result of evaluation indicates that the targeted circuit characteristics are not obtained, at least one of the frequency-characteristic equivalent circuit Ce1 (corresponding to the capacitor C) and the frequency-characteristic equivalent circuit Le1 (corresponding to the inductor L) is replaced by another frequency-characteristic equivalent circuit CeN or LeN corresponding to a component item having a different electrical characteristic. This corresponds to an action of replacing the initially selected capacitor C and inductor L by a capacitor and inductor having different specifications. By using the above expression, data Csf and data Lsf for evaluating the replaced frequency-characteristic equivalent circuits CeN and LeN are calculated again. Frequency characteristics based on the evaluation data Csf and Lsf are used to evaluate circuit characteristics again (the steps S4 and S5 shown in FIG. 1).

When the targeted circuit characteristics are obtained in steps S3 to S5, the design is completed (in the step S6 shown in FIG. 1). Obviously, when the targeted circuit characteristics are obtained in the phase of step S3, the design is completed without proceeding to steps S3 and S4.

As described above, according to the above high-frequency-circuit designing method, the component items of the basic circuit shown in FIG. 2 are respectively replaced by component equivalent circuits having corresponding component items having frequency characteristics, evaluation data items for the replaced component equivalent circuits are calculated, while changing frequency, by polynomial frequency functions, and the frequency characteristics are obtained based on the evaluation data items. Thus, it is not necessary to prepare S-parameter data tables for component items as in a conventional manner. In addition, each expression is a polynomial function using frequency as a variable. Thus, by setting the frequency and the value of n, evaluation data for the frequency can be easily calculated, and sequential evaluation data items in arbitrary frequency units and frequency range can be obtained as values approximately equal to those actually measured. Thus, based on the obtained evaluation data items, the frequency characteristics of the capacitor C and the inductor L can accurately be obtained.

In other words, it is not necessary to prepare S-parameter data tables for component items in order to design a high-frequency circuit as in a conventional manner, and, in addition, by using frequency functions, evaluation data items instead of S parameters are calculated. This enables facilitated and accurate circuit design and evaluation of circuit characteristics.

Figure 4:
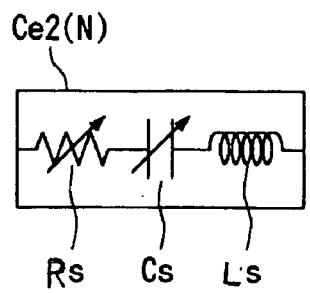
FIG. 4 is a circuit diagram showing a frequency-characteristic equivalent circuit of a high-capacitance capacitor.

Although FIG. 3 shows the frequency-characteristic equivalent circuits Ce1 corresponding to the low-capacitance capacitors C, when large-capacitance capacitors C are used, the frequency-characteristic equivalent circuit Ce2(N) shown in FIG. 4 may be used. Here, when considering a phenomenon in which the value of a resistance component Rs decreases with frequency and increases after a resonance point, and a phenomenon in which the value of a capacitance component Cs decreases with frequency, only the resistance component Rs and capacitance component Cs are provided with frequency characteristics, but an inductance component Ls is not provided with a frequency characteristic. In this case, an expression for calculating evaluation data Csf is represented by $$Csf = Cs(n) \times Freq^n + Cs(n-1) \times Freq^{(n-1)} + \ldots Cs(0)$$

where Cs represents a capacitance component, Freq represents a frequency, and n represents an integer of 2 or greater.

An expression for calculating evaluation data Rsf is identical to the above one. The above description states that a polynomial frequency function is used as the expression for calculating evaluation data. However, an expression in which terms representing variables and coefficients, such as temperature and time, are added as adding or subtracting terms to this frequency function may be used as an expression for calculating evaluation data.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of designing a high-frequency circuit, comprising the steps of:
    setting up a circuit model wherein component items constituting a basic circuit are respectively replaced by component equivalent circuits having corresponding component items having frequency characteristics;
    performing calculation of evaluation data items for evaluating the component equivalent circuits in the circuit model, while changing frequency, by using a polynomial frequency function (Xsf):

$$Xsf = Xs(n) \times Freq^n + Xs(n-1) \times Freq^{(n-1)} + \ldots Xs(0),$$

where Xs represents a parameter of an electric component, Freq represents a frequency, and n represents an integer of 2 or greater; obtaining the frequency characteristics of the component items of the basic circuit based on the evaluation data items; and using the obtained frequency characteristics to evaluate circuit characteristics; and,
    when a result of evaluation of the circuit characteristics indicates that targeted circuit characteristics are not obtained, replacing at least one of the component equivalent circuits in the circuit model by another component equivalent circuit corresponding to a component item having a different electrical characteristic, using the frequency function to calculate again evaluation data for evaluating the replaced component equivalent circuit, and evaluating again circuit characteristics by using frequency characteristics based on the calculated evaluation data items.

2. An apparatus for designing a high-frequency circuit, comprising:
    a unit for setting up a circuit model wherein component items constituting a basic circuit are respectively replaced by component equivalent circuits having corresponding component items having frequency characteristics;
    a unit for performing calculation of evaluation data items for evaluating the component equivalent circuits in the circuit model, while changing frequency, by using a polynomial frequency function(Xsf):

$$Xsf = Xs(n) \times Freq^n + Xs(n-1) \times Freq^{(n-1)} + \ldots Xs(0),$$

where Xs represents a parameter of an electric component, Freq represents a frequency, and n represents an integer of 2 or greater; obtaining the frequency characteristics of the component items of the basic circuit based on the evaluation data items; and using the obtained frequency characteristics to evaluate circuit characteristics; and a replacing unit which, when a result of evaluation of the circuit characteristics indicates that targeted circuit characteristics are not obtained, performs replacing at least one of the component equivalent circuits in the circuit model by another component equivalent circuit corresponding to a component item having a different electrical characteristic, using the frequency function to calculate again evaluation data for evaluating the replaced component equivalent circuit, and evaluating again circuit characteristics by using frequency characteristics based on the calculated evaluation data items.

3. A display method for use in designing a high-frequency circuit, comprising the steps of:

displaying a circuit model wherein component items constituting a basic circuit are respectively replaced by component equivalent circuits having corresponding component items which have frequency characteristics;

performing calculating evaluation data items for evaluating the component equivalent circuits in the circuit model, while changing frequency, by using a polynomial frequency function(Xsf):

$$Xsf = Xs(n) \times Freq^n + Xs(n-1) \times Freq^{(n-1)} + \ldots Xs(0),$$

where Xs represents a parameter of an electric component, Freq represents a frequency, and n represents an integer of 2 or greater; obtaining the frequency characteristics of the component items of the basic circuit based on the evaluation data items; and using the obtained frequency characteristics to display evaluation of circuit characteristics; and when a result of evaluation of the circuit characteristics indicates that targeted circuit characteristics are not obtained, replacing at least one of the component equivalent circuits in the circuit model by another component equivalent circuit corresponding to a component item having a different electrical characteristic, using the frequency function to calculate again evaluation data for evaluating the replaced component equivalent circuit, and displaying evaluation of circuit characteristics again by using frequency characteristics based on the calculated evaluation data items.

4. A method of designing a high-frequency circuit with targeted circuit characteristics, said high frequency circuit includes a basic circuit comprised of component items, comprising:

(i) setting up a circuit model wherein the component items of the basic circuit are respectively replaced by component equivalent circuits comprised of corresponding component items at least one of which has frequency characteristics;

(ii) calculating evaluation data Xsf using a following polynomial frequency function while changing frequency for evaluating the component equivalent circuits:

$$Xsf = Xs(n) \times Freq^n + Xs(n-1) \times Freq^{(n-1)} + \ldots Xs(0),$$

where Xs represents each corresponding component item having frequency characteristics, Freq represents a frequency, and n represents an integer of 2 or greater; thereby determining frequency characteristics of the component items of the basic circuit based on the evaluation data; and evaluating circuit characteristics of the basic circuit using the determined frequency characteristics; and (iii) repeating steps (i) and (ii) using one or more different component equivalent circuits replacing the component equivalent circuits in the circuit model, until the targeted circuit characteristics are obtained.

5. The method according to claim 4, wherein the component items comprise a capacitor and an inductor.

6. The method according to claim 5, wherein the component equivalent circuits replacing the capacitor and inductor comprise a resistance component, a capacitance component, and an inductance component.

7. The method according to claim 6, wherein at least one of the resistance component, the capacitance component, or the inductance component has frequency characteristics.

8. The method according to claim 4, wherein the high-frequency circuit is a high-pass filter having a predetermined cutoff frequency.

9. The method according to claim 4, wherein step (i) is visually displayed to a designer who designs the high-frequency circuit.

10. The method according to claim 4, wherein steps (i) through (iii) are performed without an S-parameter data table.

* * * * *